United States Patent [19]
Saen et al.

[11] Patent Number: 5,481,894
[45] Date of Patent: Jan. 9, 1996

[54] METHOD FOR MANUFACTURING A CONDUCTOR FOR A FLAT CABLE

[75] Inventors: Haruo Saen; Ryuzo Suzuki, both of Tochigi; Hiroshi Fujii; Atsushi Iizuka, both of Gunma, all of Japan

[73] Assignee: Sumitomo Electric Industries, Ltd., Osaka, Japan

[21] Appl. No.: 228,394

[22] Filed: Apr. 15, 1994

[30] Foreign Application Priority Data

| Apr. 16, 1993 | [JP] | Japan | 5-089766 |
| Aug. 2, 1993 | [JP] | Japan | 5-210859 |
| Feb. 21, 1994 | [JP] | Japan | 6-047873 |

[51] Int. Cl.$^6$ ................................................ B21B 3/00
[52] U.S. Cl. .................................... 72/200; 72/256
[58] Field of Search ................................ 72/200, 256

[56] References Cited

FOREIGN PATENT DOCUMENTS 0626702  11/1994  European Pat. Off. .
8801431  2/1988  WIPO .

OTHER PUBLICATIONS

Patent Abstracts of Japan, vol. 17, No. 133 (M-1383) Mar. 19, 1993 & JP-A-43 013 440 (Totoku Electric) Nov. 5, 1992.
American Society For Metals, "Metals Handbook", 1964, p. 284.

Primary Examiner—David Jones
Attorney, Agent, or Firm—Cushman Darby & Cushman

[57] ABSTRACT

A conductor for use in a flat cable includes thereon a tin or tin alloy plating the thickness of which is substantially uniform over the whole periphery of a flat conductor, in order to provide a conductor for use in a flat cable which can minimize variations in the plating thickness thereof, provide a good contact reliability with respect to a connector when it is used in a flat cable, and causes no increase in the contact resistance thereof in a humidity withstand test after it is inserted into and removed from the connector.

4 Claims, 2 Drawing Sheets

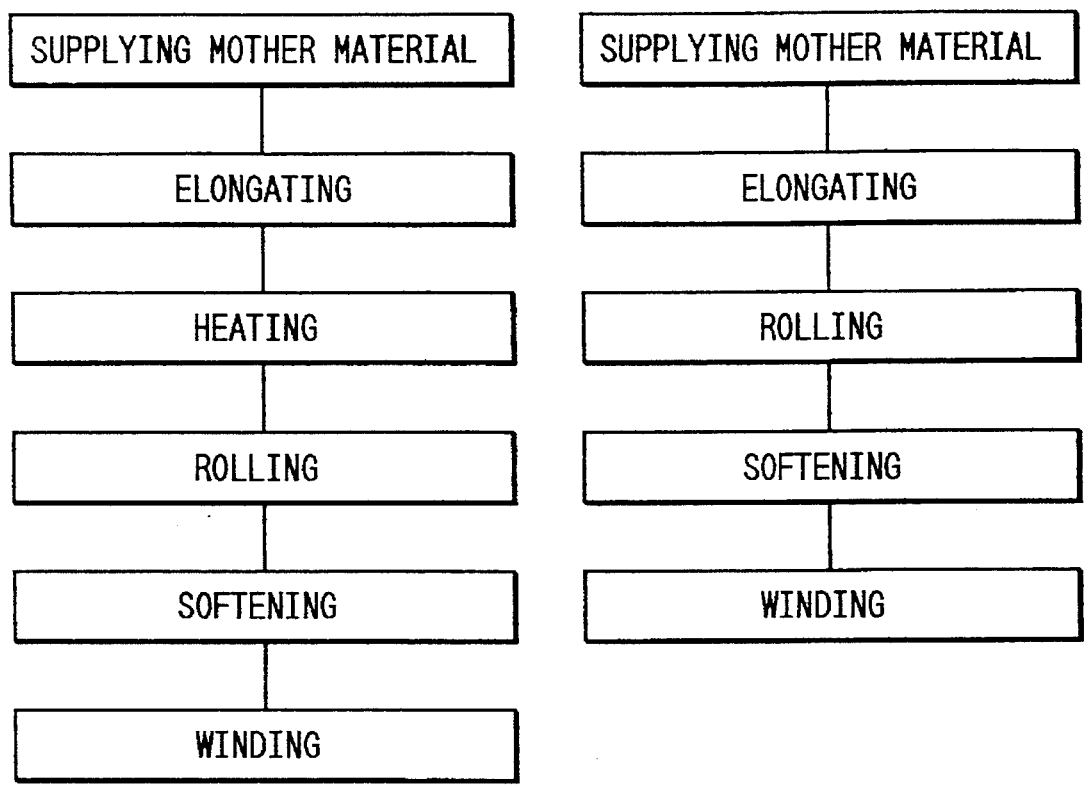
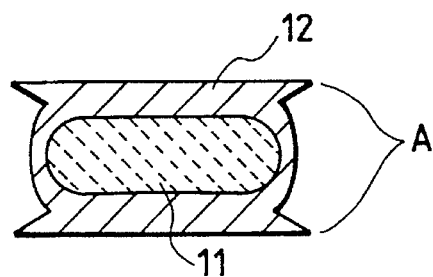

METHOD FOR MANUFACTURING A CONDUCTOR FOR A FLAT CABLE

BACKGROUND OF THE INVENTION

1. Field of the Invention

The present invention relates to a conductor for use in a thin flat cable used as an internal wiring in various kinds of electronic application products such as an electronic desktop computer, a printer, a copying machine and the like, and a method and equipment for manufacturing the conductor.

2. Description of the Related Art

Conventionally, to manufacture a thin flat cable, for example, as shown in FIG. 1, a plurality of flat conductors 11 are arranged at a predetermined distance from one another and in parallel to one another, and two polyester films 21 each having polyester system adhesives attached thereto are laminated onto the respective flat conductors from above and below with the adhesive attached surfaces of the two films facing each other, thereby forming an insulation layer 2.

This type of laminated flat cable provides a small space factor and thus is advantageous in reducing the size of the electronic application products and, therefore, it is used in various electronic application products. Especially, as shown in FIG. 2, a method of use of such a laminated flat cable, in which the conductor 1 on one surface of the end portion of the flat conductor 11 is exposed and the flat conductor 11 is then used in combination with a removable connector (which allows insertion and removal), has been used more and more frequently, because this method is advantageous in handling, that is, this method allows easy change and replacement of parts, wirings and the like.

As the method using a combination of the removable connector with the laminated flat cable of this type has become more popular, there has arisen a requirement for stable contact reliability with respect to the removable connector which needs to be frequently inserted into and removed from the laminated flat cable of this type for a long period of use. In addition, as the results of various tests for enhancement of the contact reliability with respect to the removable connector, it has been found that the contact reliability for a long period of use is closely related with a tin plating or a tin alloy plating such as a tin/lead alloy plating treated on the conductor.

In other words, as a conductor to be used in the laminated flat cable of this type, when a tin plated or tin alloy plated copper foil is slit into a predetermined width and is then used, that is, such slit copper foil is used in a state in which the slit surface thereof does not include any plating thereon, then the conductor of this type raises a problem as to the contact reliability for a long period of use. On the other hand, when the conductor is used after the slit surface thereof is also tin plated or tin alloy plated, then no problem as to the contact reliability arises even when the conductor is used for a long period of time. At the same time, however, if excessive tin plating or tin alloy plating is applied to the slit surface, then such excessive tin plating or tin alloy plating can contact a guide member or the like of a laminator and thus can be scraped off to thereby facilitate the production of tin plating or tin alloy plating refuse when the flat cable is manufactured. That is, the excessive tin plating or tin alloy plating gives rise to another problem.

As described above, if a conductor including a portion with a tin plating or a tin alloy plating having a thickness of less than a predetermined value is used as a conductor, then there arises a problem regarding to the contact reliability when the conductor is used for a long period of use. Also, if a conductor including a portion with a tin plating or a tin alloy plating having an excessively great thickness is used, then there arises another problem that plating refuse is easy to produce. Therefore, not only to provide a good contact reliability for long use but also to prevent production of the plating refuse, it is necessary to use, as a flat conductor for use in a flat cable, a conductor which is substantially uniformly tin plated or tin alloy plated with a predetermined thickness over the whole periphery thereof.

FIG. 4 is a block diagram of a conventional method of manufacturing a tin plated or tin alloy plated flat conductor. For example, a tin plated mother material of a round wire having a diameter of 0.9 mm is supplied to an elongating machine. In the elongating machine, the mother material is elongated until it reaches a section area almost identical with the size (width and thickness) of a desired flat conductor to be obtained after rolling. Next, it is supplied to a rolling machine, in which it is rolled to a predetermined flat shape. Next, the thus obtained flat material is softened by use of a softening device to thereby produce a tin plated flat annealed copper wire which is wound by a winding device.

However, the plated copper wire after elongation is turned into a hard-drawn copper wire by the elongating operation. That is, in the conventional manufacturing method of the above type, the plated hard-drawn copper wire, as it is elongated, is rolled. For this reason, the plating and the hard-drawn copper wire disposed inside the plating differ too much in elongation rate when the plated hard-drawn copper wire is rolled and thus, as shown in FIG. 5, in the straight angle section of the wire after it is rolled, the plating thicknesses of the two side surfaces of the wire are greater than the flat surface of the wire, and burrs can be easily produced in the edge portion A thereof. This section shape is maintained also by a softening operation to be performed after the rolling operation and thus, when a flat cable is manufactured, such thicker plated portions and burrs can get into contact with a guide member or the like and can be scraped off thereby, which facilitates the production of metal refuse. The thus produced metal refuse gives rise to short circuits between the conductors of a flat cable. Also, this can often raise a problem with respect to the contact reliability of the flat cable between a removable connector for a long period of use.

SUMMARY OF THE INVENTION

It is an object of the present invention to obtain a flat conductor for a flat cable which is almost uniformly tin plated or tin alloy plated with a predetermined thickness over the whole periphery thereof.

In order to achieve the above object, there is available a method in which a copper foil is slit and is then plated uniformly while the plating condition is sufficiently controlled. On the other hand, a flat conductor with a tin plating or a tin alloy plating having a uniform thickness can be obtained more easily according to another method in which a round copper wire with a tin plating or a tin alloy plating is rolled down flat by a roller and is then heated and softened at a predetermined temperature.

However, even in a method of rolling a round copper wire into a flat conductor by use of a roller, if the round copper wire is a hard-drawn round copper wire which is plated with tin or tin alloy and is then elongated to a given shape, then the thickness of the plating of the thus elongated wire becomes not uniform in a step of rolling the hard-drawn round wire into the flat conductor. Also, the malleability of the round copper wire have to be matched to that of the plating applied thereto. For example, in order to provide a flat conductor with a tin plating or a tin alloy plating uniform in thickness over the whole periphery thereof, it is preferable to roll a tin plated or tin alloy plated annealed copper round wire having an elongation ratio of 10% or more into a flat conductor. Namely, in a method in which a tin plated or tin alloy plated round copper wire is elongated to thereby reduce its size (width and thickness) and is then rolled to be a flat one by use of a roller, the round copper may be reduced in size by elongation, may be heated under a predetermined condition and then may be rolled to a flat shape by a roller to thereby produce a desired flat conductor.

BRIEF DESCRIPTION OF THE DRAWINGS

In the drawings;

FIG. 3 is a block diagram of a method of manufacturing a conductor for use in a flat cable according to the invention;

FIG. 4 is a block diagram of a conventional method of manufacturing a conductor for use in a flat cable; and FIG. 5 is a transverse section view of a flat conductor included in a conductor.

DETAILED DESCRIPTION OF THE INVENTION

The detailed description of the present invention will be described accompanying with the drawings.

FIG. 3 is a block diagram of a method of manufacturing a flat cable according to the present invention. As shown in FIG. 3, there is provided a heating step between an elongating step and a rolling step. In an equipment for manufacturing a flat cable of the present invention, a heating device is provided between an elongating device and a rolling device so that the elongating step, the heating step and the rolling step is conducted continuously to manufacture the flat cable efficiently. A heating temperature may vary according to a heating time and a temperature of 130° C. or more is preferable. A heating condition to be able to soften the copper that is the core material of the wire is desirable but it is not always an essential condition to be able to soften the copper. Although this has not been solved in theory, it can be estimated that it is related with the metallic change of the plated layer, a mutual dispersion in an interface between the plated layer and the copper wire, and the like.

After being heated in this heating step, the copper wire is rolled into a predetermined flat shape by a rolling machine and is then heated again, whereby there can be produced a flat annealed copper wire, which is wound in a winding step, for use in a flat cable which is tin or tin alloy plated uniformly over the whole periphery thereof.

(Embodiment 1)

Figure 1:
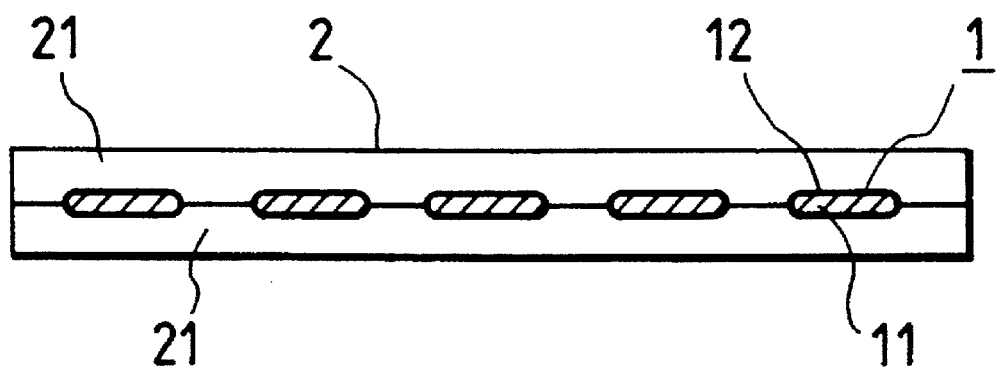
FIG. 1 is a sectional view of a conductor for use in a flat cable according to the invention.
Figure 2:
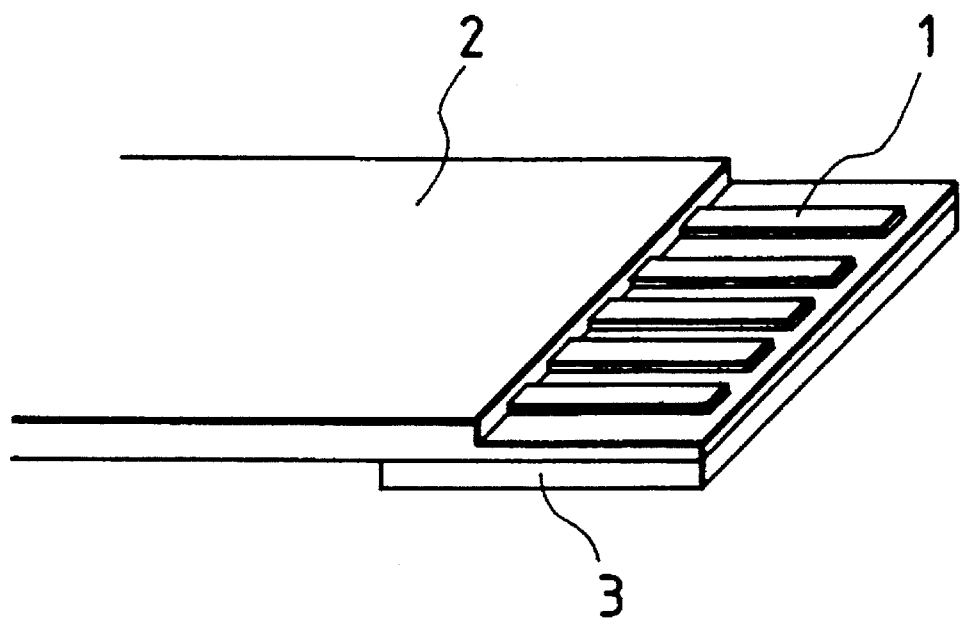
FIG. 2 is a perspective view of the conductor for use in a flat cable shown in FIG. 1, showing a state thereof in which one surface of the conductor is exposed for fitting with a connector.

A copper wire of 0.9 mm of electrically plated with tin of 4.5 µm was elongated to a wire of 0.3 mm by an elongation unit and was then electrically softened. The resultant annealed copper wire having a plating thickness of 1.5 µm and an elongation rate of 13% was rolled down to thereby produce a flat conductor having a long diameter of 0.7 mm and a short diameter of 0.1 mm. The flat conductor was then heated and softened under a predetermined condition, with the result that there could be produced a tin plated flat conductor having a substantially uniform tin plating thickness ranging from a maximum value of 1.6 µm to a minimum value of 1.2 µm over the whole periphery thereof. Five of such flat conductors were arranged in parallel at a pitch of 1 mm and two polyester films each having polyester system adhesive attached thereto are laminated onto the five flat conductors from above and below with the adhesive attached surfaces of the respective films facing each other. Then, the laminated unit was cut into a predetermined length, one surface of the end conductor was exposed by peeling off the end portion insulation from this surface, and reinforcing plate 3 was attached on another side, so that there was produced such a flat cable as shown in FIGS. 1 and 2.

(Comparative Example)

For comparative example with the first embodiment described above, a copper wire having a diameter of 0.9 mm and plated with a tin-lead alloy containing 5% lead was elongated to a copper wire which has a diameter of 0.32 mm and having a plating thickness of 1.5 µm. The copper wire was then rolled to thereby produce a flat conductor having a thickness of 0.1 mm and a width of 0.8 mm. Next, the flat conductor is electrically softened to thereby produce a tin-lead alloy plated annealed copper flat conductor having an elongation percentage of 18%. The plating thicknesses of the section of the thus produced tin-lead alloy plated annealed copper flat conductor were found to vary greatly from a maximum value of 3.2 µm (in the side surface portion of the conductor) to a minimum value of 0.2 µm (in the edge portion thereof).

(Embodiment 2)

In a second embodiment according to the invention, after the tin-lead alloy plated copper wire was elongated similarly to the comparative example, the copper wire was heated by use of a tunnel furnace until the elongation percentage of the plated copper wire reached 15 to 20%, before it was rolled in a rolling machine. Then, the copper wire was rolled and softened similarly to the above to thereby produce a flat conductor. In the thus produced flat conductor, it was confirmed that the thicknesses of the plating in the section of the conductor varies from a maximum value of 1.7 µm to a minimum value of 1.2 µm, that is, the variations in the plating thicknesses in this embodiment are much smaller than those in the above-mentioned comparative example.

(Embodiment 3)

Also, according to third embodiment of the invention, a tin-lead alloy plated copper wire, which had been elongated and wound similarly to the above comparative example, was put into a heating furnace of a pot type and was heated there for two hours at a temperature of 130° C. After heated, the plated copper wire had an elongation percentage of 2%. When the plated copper wire was then rolled and softened similarly to the comparative example, then the variations in the plating thickness in the section of the wire were found to range from a maximum value of 1.9 µm to a minimum value of 1.0 µm, that is, according to the embodiment of the invention, the variations in the plating thickness can be improved far greatly over the comparative example. Although the plating thicknesses of the plated copper wire after elongation and heating but before rolling must be uniform, to plate a round wire with a uniform thickness can be enforced easily by using any one of conventional plating methods. Also, the plating thickness before rolling is preferably at least 1.5 μm.

According to the present invention, there can be produced a flat cable using a plurality of flat conductors each having a substantially uniform plating thickness over the whole periphery thereof. The thus produced flat cable can eliminate the possibility that plating refuse is produced during the laminating step, provide a good inter-conductor voltage withstand at a pitch of 1 mm, and also respond to the need for a further high density wiring such as at a pitch of 0.5 mm and the like. Also, the end portion of the flat cable manufactured according to the invention enjoys a good contact reliability with respect to a connector and, even in a humidity withstand test after the flat cable is inserted into and removed from the connector, no increase can be found in the contact resistance thereof.

The above-mentioned effects can also be obtained by use of a flat conductor which is tin plated or tin alloy plated and is then slit, provided that the slit surface thereof is plated with a predetermined thickness to thereby produce a conductor having a substantially uniform plating thickness of 1 μm or more over the whole periphery thereof. However, the conditions for plating the slit surface are difficult to satisfy. That is, there is a possibility that the slit surface of the produced conductor can have an unnecessarily large plating thickness, for example, a thickness of 4 to 5 μm. If such a conductor is used, then the thick plating can contact a guide member and the like during the laminating operation and thus the plating can be scraped off to thereby produce plating refuse. The plating refuse will be laminated together with the conductor to thereby extremely lower an inter-conductor voltage withstand. Accordingly, it is preferable that the thickness of the plating is from 1 to 3 μm.

On the other hand, after a tin plated copper foil is slit into a predetermined width and the copper of the slit surface is exposed, the conductor can be used as it is. In this case, in a humidity withstand test after the conductor is inserted into and removed from a connector, there is found an increase in the contact resistance thereof and, in the worst case, there is found such a conductor that cannot conduct at all.

Also, when a tin plated hard-drawn copper round wire is rolled to thereby produce a flat conductor, even if the tin plating thickness is uniform when the conductor is still a round wire, the flat conductor includes a portion the tin plating thickness of which is extremely thin. Thus, when such flat conductor is used, in a humidity withstand test after the conductor is inserted into and removed from a connector, an increase in the contact resistance of the conductor can be found.

What is claimed is:

1. A method of manufacturing a conductor for a flat cable comprising the steps of:

rolling a tin or tin alloy plated conductive material into an elongated material of a predetermined size;

heating said elongated material;

rolling said heated material to produce a flat conductor; and softening the flat conductor.

2. A method of manufacturing a conductor for a flat cable according to claim 1, wherein said conductive material is a copper round wire.

3. A method of manufacturing a conductor for a flat cable according to claim 1, wherein said elongated material is heated at a temperature of 130° C. or higher.

4. A method of manufacturing a conductor for use in a flat cable comprising the steps of:

rolling annealed copper wire, which is plated by tin or tin alloy with a substantially uniform thickness over an entire periphery of said annealed copper wire, elongating said annealed copper wire by an elongation ratio of at least 10%;

heating said annealed, elongated copper wire;

rolling said annealed copper wire to produce a flat conductor; and softening the flat conductor.

* * * * *